United States Patent [19]

Baliga

[11] Patent Number: 4,523,111

[45] Date of Patent: Jun. 11, 1985

[54] NORMALLY-OFF, GATE-CONTROLLED ELECTRICAL CIRCUIT WITH LOW ON-RESISTANCE

[75] Inventor: Bantval J. Baliga, Clifton Park, N.Y.

[73] Assignee: General Electric Company, Schenectady, N.Y.

[21] Appl. No.: 473,089

[22] Filed: Mar. 7, 1983

[51] Int. Cl.³ .................. H03K 17/60; H03K 3/353
[52] U.S. Cl. .................... 307/574; 307/581;
307/252 A; 307/252 Q; 307/304
[58] Field of Search ........... 307/252 A, 252 Q, 570,
307/571, 573, 574, 575, 577, 581, 584, 304;
357/41, 42

[56] References Cited

U.S. PATENT DOCUMENTS 3,521,141  7/1970  Walton .......................... 307/581

OTHER PUBLICATIONS

B. J. Baliga, "Bipolar Operation of Power Junction Field-Effect Transistors", Electronics Letters, vol. 16 (Apr. 1980), pp. 300-301.

Primary Examiner—Stanley D. Miller
Assistant Examiner—Loha Ben
Attorney, Agent, or Firm—Charles E. Bruzga; James C. Davis, Jr.; Marvin Snyder

[57] ABSTRACT

An electrical circuit includes a JFET serially connected to an IGFET, the gate of the IGFET constituting the gate for the circuit. Biasing structure, such as a resistor, is connected between the circuit gate and the gate of the JFET for forward-biasing the P-N junction of the JFET extant between its gate and channel regions. When this P-N junction is biased by more than about 0.6 volts for a silicon JFET, the JFET gate region injects current carriers into the JFET channel region, whereby bipolar conduction occurs in the JFET channel region and low on-resistance for the circuit is achieved. In a preferred circuit the biasing structure comprises an IGFET, which advantageously results in the circuit gate having a high input impedance.

6 Claims, 3 Drawing Figures

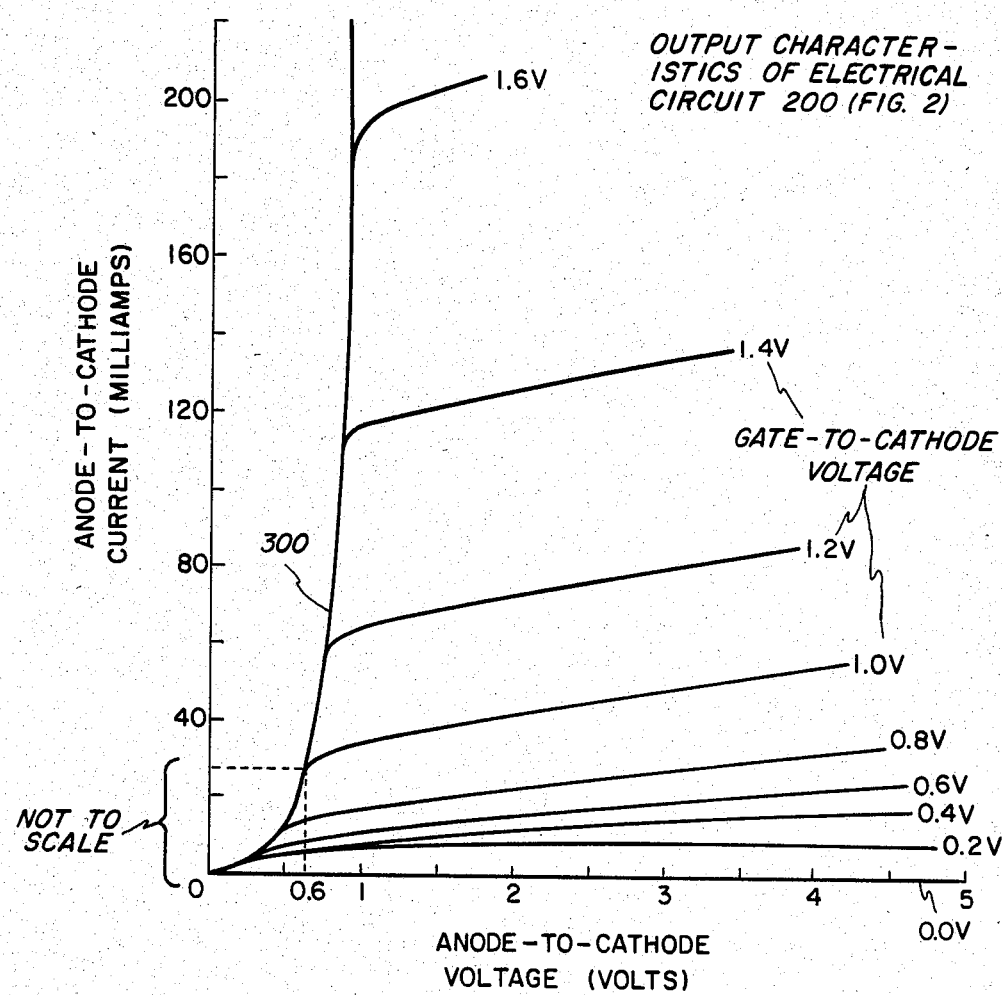

NORMALLY-OFF, GATE-CONTROLLED ELECTRICAL CIRCUIT WITH LOW ON-RESISTANCE

CROSS REFERENCE TO RELATED APPLICATION

This application is related to the following co-pending U.S. patent applications assigned to the present assignee: Ser. No. 257,080, entitled "COMPOSITE CIRCUIT FOR POWER SEMICONDUCTOR SWITCHING," by B. J. Baliga (the present inventor) and M. S. Adler; and Ser. No. 455,174 entitled "NORMALLY-OFF SEMICONDUCTOR DEVICE WITH LOW ON-RESISTANCE AND CIRCUIT ANALOGUE", by B. J. Baliga (the present inventor).

BACKGROUND OF THE INVENTION

The present invention relates to a normally-off electrical circuit with low on-resistance and particularly to such a circuit suitable for power switching applications.

A prior art junction field effect transistor (JFET) of the N-channel type typically comprises a channel region of N-type semiconductor material and a P-type gate region adjoining the N-type channel region and forming a P-N junction therewith. Upon reverse biasing of this P-N junction through appropriate biasing of the P-type gate region, a depletion region is formed in the N-type channel region in the vicinity of the P-N junction and extends into the channel region so as to shrink the portion of the channel that can conduct current. When the depletion region has spread across the entire channel, the JFET is in, what is known in the art, as a pinched-off condition in which it cannot conduct current.

A JFET is a normally-on or -conducting device; that is, a JFET's gate region must be actively biased in order to pinch off the JFET and terminate current conduction through the device. In many applications, however, it is desirable to have normally-off device operation. Such normally-off operation is achieved in an electrical circuit described and claimed in copending U.S. patent application Ser. No. 257,080, filed 24 April, 1981 by B. J. Baliga (the present inventor) and M. S. Adler, and assigned to the present assignee. In such circuit, a JFET is serially connected to a bipolar transistor, with the base electrode of the bipolar transistor serving as a gate or control electrode for the entire circuit. Normally-off operation of the JFET is achieved because the base electrode must be appropriately biased to turn on the bipolar transistor and allow the JFET to conduct current.

In the foregoing electrical circuit, the gate of the JFET is electrically shorted to the emitter of the bipolar transistor, resulting in the P-N junction of the JFET being reverse-biased, at least to a slight extent, while the JFET is conducting current. As a consequence, the circuit cannot take advantage of a technique for markedly lowering the on-resistance of a JFET, which requires forward-biasing of the P-N junction of the JFET. In a JFET having its P-N junction sufficiently forward-biased so as to utilize this technique, the JFET's P-type gate region injects holes into the N-type channel region which already contains electrons, whereby the JFET operates in a bipolar conduction mode. This results in a lowering of the channel resistance, and hence the on-resistance of the JFET. By controlling the level of the biasing voltage on the JFET's gate, the extent of carrier injection into the N-type channel and, hence, the on-resistance of the JFET, is modulated. This technique is discussed in detail in an article by B. J. Baliga, entitled "Bipolar Operation of Power Junction Gate Field-Effect-Transistors", Electron Letters, Vol. 16 (1980), pages 300–301 which is incorporated herein by reference.

It would be desirable to provide an electrical circuit including a JFET and operating in a normally-off fashion, yet which utilizes the foregoing technique for achieving a markedly reduced on-resistance by means of forward-biasing its P-N junction.

SUMMARY OF THE INVENTION

Accordingly, it is an object of my invention to provide an electrical circuit including a JFET and operating in a normally-off fashion and with markedly reduced on-resistance when the JFET P-N junction is forward-biased.

A further object of my invention is to provide a gate-controlled electrical circuit including a JFET and operating in a normally-off fashion with reduced on-resistance, wherein the circuit gate input impedance is desirably high.

In accordance with a preferred embodiment of my invention, I provide an electrical circuit including a JFET with source, drain, and gate electrodes; and an insulated gate field-effect, transistor (IGFET) having source, drain, and gate electrodes and being of the normally-off type. The JFET source electrode is ohmically connected to the IGFET drain electrode and the JFET drain electrode and the IGFET source electrode are adapted to carry load current through the circuit. The IGFET gate electrode constitutes a circuit gate electrode for receiving control signals that determine the conductivity state of the circuit. Further included in the circuit are bias means interconnected with both the JFET and IGFET gate electrode and responsive to control signals on the circuit gate for biasing the JFET into a bipolar condition mode when the IGFET is biased into an on-state, thereby achieving low on-resistance in the electrical circuit.

The bias means of the electrical circuit may comprise, by way of example, a resistance means electrically interposed between the JFET and IGFET gate electrodes. A more preferred form of the bias means comprises a second IGFET having source, drain, and gate electrodes and being of the normally-off type, with the second IGFET gate electrode connected to the first-mentioned IGFET gate electrode, the second IGFET source electrode connected to the JFET gate electrode, and the second IGFET drain electrode connected to the JFET drain electrode. The use of the foregoing bias means in the electrical circuit results in the circuit gate advantageously having a high input impedance.

BRIEF DESCRIPTION OF THE DRAWINGS

The features of the invention believed to be novel and an obvious over the prior art are set forth with particularly in the appended claims. The invention itself, both as to organization and method of operation, together with further objects and advantages thereof, may be best understood by reference to the following description considered in connection with the accompanying drawings, in which:

DESCRIPTION OF THE PREFERRED EMBODIMENTS

Figure 1:
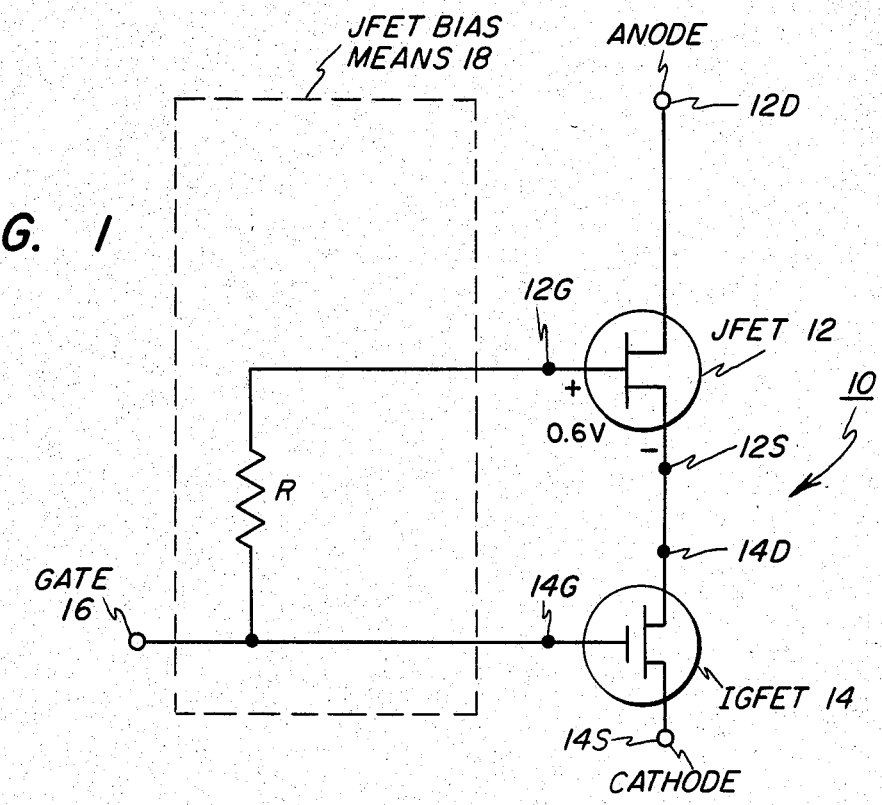
FIG. 1 is a schematic diagram of a normally-off, gate-controlled electrical circuit with low on-resistance in accordance with my invention.

There is illustrated in FIG. 1 an electrical circuit 10 in accordance with my invention. Circuit 10 includes JFET 12 having source, drain and gate electrodes 12S, 12D and 12G, respectively. JFET 12 is preferably of the N-channel type and, as is known, is of the normally-on type. In order to achieve normally-off operation of circuit 10, there is additionally provided IGFET 14 of the normally-off (or enhancement mode) type, preferably being of the N-channel type. IGFET 14 has source, drain and gate electrodes 14S, 14D and 14G, respectively. IGFET drain electrode 14D is ohmically interconnected with JFET source electrode 12S. JFET drain electrode 12D and IGFET source electrode 14S are adapted to be connected to external circuitry (not shown) so as to carry load current through circuit 10. With JFET 12 and IGFET 14 comprising N-channel type transistors, JFET drain electrode 12D constitutes the anode electrode of circuit 10 and IGFET source electrode 14S constitutes the cathode electrode of circuit 10.

IGFET gate electrode 14G is adapted to receive control signals for determining the conductivity state of electrical circuit 10 between anode electrode 12D and cathode electrode 14S. Accordingly, IGFET gate electrode 14G is illustrated as being electrically shorted to gate 16 of circuit 10 so that they are electrically indistinguishable from each other.

In order to achieve low on-resistance in circuit 10, a JFET bias means 18, ohmically interconnected with both JFET gate electrode 12G and IGFET gate electrode 14G, is provided. Bias means 18 is responsive to control signals on IGFET gate 14G and serves to bias JFET 12 into a bipolar conduction mode by forward-biasing the internal P-N junction (not illustrated) of JFET 12 by more than about 0.6 volts, at least for a silicon device 12.

The particular embodiment of JFET bias means 18 illustrated in FIG. 1 comprises an impedance element, such as a resistor R, having one of its terminals connected to JFET gate electrode 12G and the other of its terminals connected to IGFET gate electrode 14G. The impedance value of resistor R is selected to assure that JFET 12 is biased into a bipolar conduction mode at the same time that a control signal on circuit gate 16 is biasing IGFET 14 into an "on" or conductive state. By way of example, where electrical circuit 10 is intended to carry a current of 2 amps and the available biasing voltage for gate 16 is in the range from about 5 to 10 volts, for a silicon JFET 12, the value of resistor R is typically in the range of about 25 ohms to 50 ohms.

JFET 12, which is preferably of the recessed-gate type, typically comprises a high breakdown-voltage transistor with a typical rating of 600 volts, and IGFET 14 typically comprises a low breakdown-voltage transistor with a typical rating of 50 volts. An electrical circuit 10 having JFET 12 and IGFET 14 selected in accordance with the foregoing characteristics was assembled and tested, and such circuit 10 exhibits a level of on-resistance of about $10^{-2}$ ohms per square centimeter. This low level of on-resistance is achieved through the provision of JFET bias means 18 which serves to bias JFET 12 into a bipolar conduction mode. By way of comparison, if JFET 12 were not biased into a bipolar conduction mode as with bias means 18, the on-resistance of serially-connected JFET 12 and IGFET 14 would be about 1 ohm per square centimeter, an increase in resistance of about 100 times that of electrical circuit 10 incorporating JFET bias means 18.

Each of JFET 12, IGFET 14 and resistance R may comprise individual or discrete circuit elements, or any two or preferably all three of the circuit elements may be fabricated in monolithic integrated circuit form (not shown).

Figure 2:
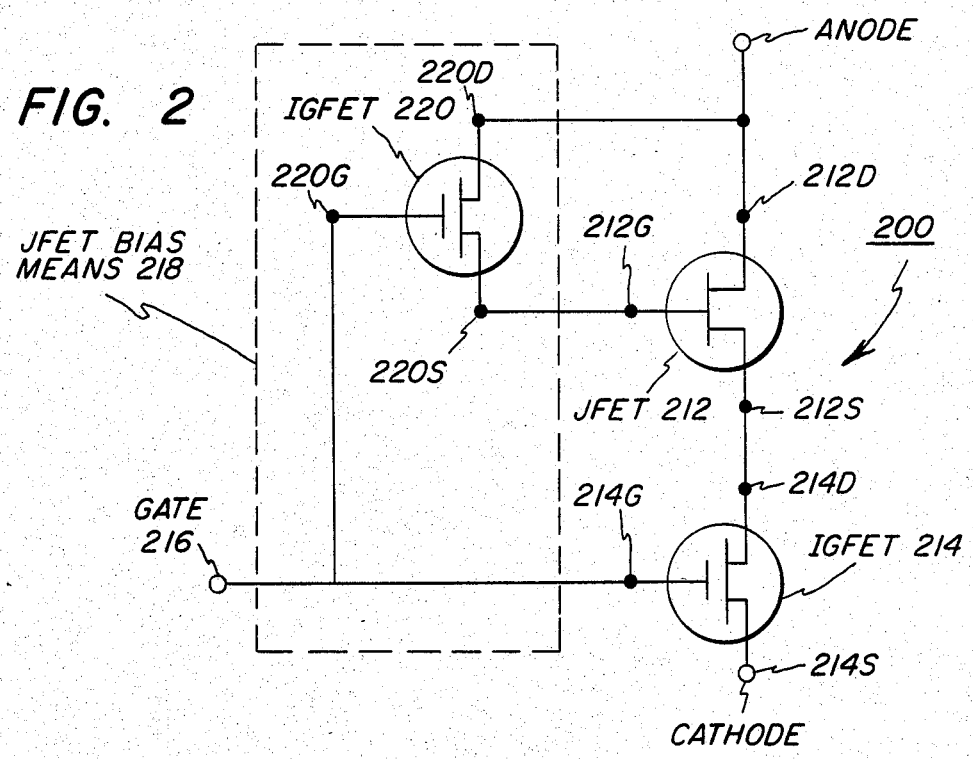
FIG. 2 is a schematic diagram of a further normally-off, gate-controlled electrical circuit with low-on resistance in accordance with a further embodiment of my invention.

Turning to FIG. 2, there is illustrated an electrical circuit 200 in accordance with a further embodiment of my invention. Circuit 200 is suitably identical to circuit 10 of FIG. 1, except for the inclusion of a different JFET bias means 218 which beneficially results in gate 16 of circuit 200 having a high input impedance.

JFET bias means 218 comprises an IGFET 220 having source, drain and gate electrodes 220S, 220D, and 220G, respectively, and being of the normally-off type. IGFET 220 must be of the N-channel type. IGFET 220 preferably has a breakdown voltage rating comparable to that of JFET 212, inasmuch as each of IGFET 220 and JFET 212 supports essentially the same voltage when circuit 220 is in an off or non-conducting state. IGFET source electrode 220S is ohmically connected to JFET gate electrode 212G, and IGFET drain electrode 220D is ohmically connected to JFET drain electrode 212D. TGFET gate electrode 220G is electrically shorted to IGFET gate electrode 214G so as to be indistinuishable therefrom, and also from circuit gate 216 on which there are received control signals for determining the conductivity state of circuit 200. Gate 216 advantageously has a high input impedance because it is connected to only high input impedance gate electrodes 214G and 220G. Accordingly, appropriate gating circuitry (not shown) for gate 216 can be less complicated than appropriate gating circuitry (not shown) for gate 16 of electrical circuit 10 (FIG. 1), since the gating circuitry for gate 216, unlike the gating circuitry for gate 16, need only supply a minute level of current.

In operation of electrical circuit 200, JFET 212 is biased into a bipolar conduction mode when the voltage of anode 212D, with respect to cathode 214S, is sufficiently high so as to forward bias the P-N junction in JFET 212 (i.e., this junction between JFET gate electrode 212 and source electrode 212S), by more than about 0.6 volts, at least for a silicon JFET 212. Because the voltage drops across IGFET's 220 and 214 are negligible compared to 0.6 volts, this means that anode 212D must similarly be biased above about 0.6 volts before JFET 212 is biased into a bipolar conduction mode.

The effect of the foregoing 0.6 volt biasing requirement for anode 212D can be further appreciated by considering the graphical depiction of the output or I-V characteristics of electrical circuit 200 appearing in FIG. 3. As is indicated in FIG. 3, electrical circuit 200 exhibits a very low on-resistance once the anode-to-cathode voltage exceeds 0.6 volts, as indicated by the steeply inclined curve 300. At lower anode-to-cathode voltages wherein JFET 212 is not biased into a bipolar conduction mode, circuit 200 exhibits, as shown in exaggerated form, an active region wherein its anode-tocathode voltage is predominantly controlled by the biasing of IGFET 214.

Electrical circuit 200 attains the same low level of on-resistance as does electrical circuit 10 of FIG. 1, as discussed in quantitative terms above. Circuit 200 additionally exhibits very fast turn-off speed. In a test of turn-off speed of circuit 200, devices 212, 214, and 220 having respective breakdown voltage ratings of 600 volts, 50 volts and 500 volts, and with a 200 ohm load energized by a 150 volt direct current source connected between anode 212D and cathode 214S, circuit 200 exhibited a short carrier storage time of about 100 nanoseconds followed by a rapid fall time in current of less than about 500 nanoseconds. Advantageously, then, electrical circuit 210 is well suited for power switching applications at high frequencies up to about 100 kilohertz wherein low switching losses are crucial.

Each of JFET 212, IGFET 214 and IGFET 220 may comprise individual or discrete circuit elements, or any two or preferably all three of the devices may be formed in monolithic integrated circuit form (not shown).

The foregoing describes different versions of an electrical circuit including a JFET and operating in a normally-off fashion, which circuit achieves a markedly reduced on-resistance through forward-biasing of the JFET's P-N junction. A preferred version of the circuit advantageously has a gate with a high input impedance.

While my invention has been described with respect to specific embodiments, many modifications and substitutions will be apparent to those skilled in the art. For example electrical circuits could be made in which complementary semiconductor devices are utilized; that is, a P-channel JFET substituted for an N-channel JFET, and P-channel IGFETs substituted for N-channel IFGETs. It is, therefore to be understood that the appended claims are intended to cover these and all such modifications and substitutions as fall within the true spirit and scope of the invention.

What I claim as my invention and desire to have secured by letters Patent of the United States is:

1. A normally-off, gate-controlled electrical circuit with low on-resistance, comprising:

(a) a JFET having source, drain and gate electrodes;
(b) an IGFET having source, drain and gate electrodes and being of the normally-off type;
(c) the JFET source electrode and the IGFET drain electrode being ohmically connected together and the JFET drain electrode and the IGFET source electrode being adapted to carry load current through the electrical circuit;
(d) the IGFET gate electrode constituting a circuit gate electrode for receiving control signals that determine the conductivity state of the circuit, and
(e) bias means interconnected with both the JFET and IGFET gate electrodes and responsive to control signals on the circuit gate for biasing said JFET into a bipolar conduction mode when said IGFET is in a conduction state, whereby low on-resistance of the electrical circuit is attained.

2. The electrical circuit of claim 1 wherein said bias means comprises an impedance means electrically interposed between the IGFET gate electrode and the JFET gate electrode.

3. The electrical circuit of claim 2 wherein said impedance means comprises a resistor electrically interposed between the JFET gate electrode and the IGFET gate electrode.

4. The electrical circuit of claim 2 wherein both said JFET and said IGFET comprise N-channel type devices.

5. The electrical circuit of claim 1 wherein said bias means comprises a second IGFET having source, drain and gate electrodes and being of the normally-off type; the second IGFET gate electrode being electrically shorted to the first-mentioned IGFET gate electrode, the second IGFET source electrode being ohmically connected to the JFET gate electrode and the second IGFET drain electrode being ohmically connected to the JFET drain electrode, whereby the circuit gate achieves a high input impedance.

6. The electrical circuit of claim 5 wherein said JFET comprises an N-channel type device and both said first-mentioned and said second IGFETs comprise N-channel type devices.

* * * * *